United States Patent [19]
Nakao

[11] Patent Number: 5,964,989
[45] Date of Patent: Oct. 12, 1999

[54] IONIZED PVD DEVICE AND METHOD OF MANUFACTURING SEMICONDUCTOR DEVICE

[75] Inventor: Shuji Nakao, Tokyo, Japan

[73] Assignee: Mitsubishi Denki Kabushiki Kaisha, Tokyo, Japan

[21] Appl. No.: 08/861,637

[22] Filed: May 22, 1997

[30] Foreign Application Priority Data

Dec. 13, 1996 [JP] Japan .................................. 8-333698

[51] Int. Cl.$^6$ ................................................ C23C 14/34
[52] U.S. Cl. ............................. 204/192.12; 204/192.25; 204/298.05; 204/298.08; 204/298.13; 204/298.15; 204/298.16; 204/192.17
[58] Field of Search ..................... 204/298.16, 298.08, 204/298.05, 298.04, 298.18, 192.38, 298.41, 298.36, 298.37, 192.12, 192.25, 298.15, 298.13, 192.17

[56] References Cited

U.S. PATENT DOCUMENTS

| | | | |
|---|---|---|---|
| 3,887,451 | 6/1975 | Cuomo et al. | 204/192 |
| 3,916,034 | 10/1975 | Tsuchimoto | 427/38 |
| 4,867,859 | 9/1989 | Harada et al. | 204/298 |
| 4,871,433 | 10/1989 | Wagner et al. | 204/192.12 |
| 4,925,542 | 5/1990 | Kidd | 427/531 |
| 5,126,033 | 6/1992 | Szczyrbowski et al. | 204/298.08 |
| 5,302,266 | 4/1994 | Grabarz et al. | 204/192.12 |
| 5,330,628 | 7/1994 | Demaray et al. | 204/192.12 |
| 5,354,445 | 10/1994 | Ito et al. | 204/298.05 |
| 5,433,836 | 7/1995 | Martin et al. | 204/298.41 |
| 5,480,527 | 1/1996 | Welty | 204/192.38 |
| 5,487,822 | 1/1996 | Demaray et al. | 204/298.09 |
| 5,685,960 | 11/1997 | Fu et al. | 204/192.3 |
| 5,840,163 | 11/1998 | Welty | 204/192.38 |

FOREIGN PATENT DOCUMENTS

| | | |
|---|---|---|
| 2-133571 | 5/1990 | Japan . |
| 4-350157 | 12/1992 | Japan . |

*Primary Examiner*—Nam Nguyen
*Assistant Examiner*—Julian A. Mercado
*Attorney, Agent, or Firm*—Oblon, Spivak, McClelland, Maier & Neustadt, P.C.

[57] ABSTRACT

Provided are an ionized PVD device capable of performing film formation having excellent vertical growth, and more particularly an ionized PVD device having a comparatively simple structure in which a rate of a metal film formed by neutral metal atoms can be reduced in a contact hole of a semiconductor substrate to perform film formation having excellent bottom coverage, and a method for manufacturing a semiconductor device using the ionized PVD device. Air-core coils are provided on an outside of a vacuum chamber concentrically with a central axis of the vacuum chamber and an extension axis of the central axis. The air-core coils are electromagnets for forming an S-shaped magnetic field in the vacuum chamber almost along a contour shape thereof. The air-core coils are provided so as to form the magnetic field in a straight portion in the vicinity of both ends of the vacuum chamber, and the air-core coils are provided so as to form the magnetic field in a bent portion of the vacuum chamber.

9 Claims, 9 Drawing Sheets

IONIZED PVD DEVICE AND METHOD OF MANUFACTURING SEMICONDUCTOR DEVICE

BACKGROUND OF THE INVENTION

1. Field of the Invention

The present invention relates to an ionized PVD device and a method for manufacturing a semiconductor device, and more particularly to an ionized PVD device capable of performing film formation having excellent vertical growth, and a method for manufacturing a semiconductor device using the ionized PVD device.

2. Description of the Background Art

With reference to FIG. 9, a structure of a conventional ionized PVD (Physical Vapour Deposition) device 90 will be described below. FIG. 9 is a schematically sectional view for explaining the structure of the ionized PVD device 90.

As shown in FIG. 9, the ionized PVD device 90 comprises a cylindrical vacuum chamber 20 having a bottom and a cover in which a high-frequency coil (RF coil) 21, a sputtering target 22 and a wafer susceptor 23 are incorporated.

The high-frequency coil 21 is provided in a central portion of the vacuum chamber 20 such that a direction of a central axis thereof is coincident with that of a central axis of the vacuum chamber 20. Both ends of the high-frequency coil 21 are electrically connected to a high-frequency power supply R1 and a ground potential GND through current introducing terminals (feedthrough terminals) 24A and 24B provided on a side wall section 201 of the vacuum chamber 20.

The sputtering target 22 is attached to a cover section 202 which is electrically insulated from the side wall section 201 of the vacuum chamber 20 through an electric insulator 25, and is electrically connected to a negative output terminal of a DC power supply D1 through the cover section 202. The side wall section 201 and a bottom section 203 of the vacuum chamber 20 are electrically connected to a ground potential GND.

A peripheral portion of the sputtering target 22 is covered with a dark space shield 27.

A wafer 30 is mounted on the wafer susceptor 23. The wafer susceptor 23 serves to apply a high-frequency bias to the wafer 30, and includes a table 231 for mounting the wafer 30 thereon, and a strut 232 for supporting the table 231. The strut 232 is connected to a high-frequency power supply R2 through the bottom section 203 of the vacuum chamber 20, and is electrically insulated from the bottom section 203 by an electric insulator 26.

Operation of the ionized PVD device 90 will be described below with reference to FIG. 9.

First of all, the vacuum chamber 20 is sealed to exhaust air in the vacuum chamber 20 from an exhaust port which is not shown and to reduce a pressure of the vacuum chamber 20 to a predetermined value. Then, a rare gas such as an argon gas is introduced into the vacuum chamber 20 through a gas inlet which is not shown to raise the pressure of the vacuum chamber 20 to a predetermined value.

The sputtering target 22 is electrically connected to the negative output terminal of the DC power supply D1 through the cover section 202. For this reason, when a voltage is applied from the DC power supply D1, the sputtering gate 22 functions as a cathode. Since the side wall section 201 of the vacuum chamber 20 is connected to the ground potential GND, it functions as an anode. When an output voltage of the DC power supply D1 reaches a predetermined value, a plasma AP is produced in the vacuum chamber 20.

Argon ions in the plasma AP collide with the sputtering target 22 which acts as a negative potential, and sputter a component of the sputtering target 22, for example, titanium (Ti) as neutral atoms or titanium ions. A material of the sputtering target 22 is determined according to a composition of a desired film to be formed on the wafer 30 which will be described below.

The high-frequency coil 21 is provided so as to surround a region where the plasma AP is formed. A high-frequency current is caused to flow from the high-frequency power supply R1 to the high-frequency coil 21 so that an induction field is formed in the plasma AP. Electrons in the plasma AP are accelerated by the induction field. Consequently, a density (an ionization degree) of the plasma can be increased by ionization function of the accelerated electrons.

The neutral atoms or ions of titanium sputtered from the sputtering target 22 enter the plasma AP, and the neutral atoms are ionized by the accelerated electrons.

The titanium ions move in the plasma AP to approach the wafer 30. A wafer-plasma DC electric field which is induced by a high-frequency voltage applied from the high-frequency power supply R2 to the wafer 30 through the wafer susceptor 23 is present between a surface of the wafer 30 and the plasma AP. Consequently, the titanium ions are accelerated by the DC electric field and are caused to be incident on the wafer 30 almost perpendicularly.

If the titanium ions are incident on the wafer 30 almost perpendicularly, film formation having excellent bottom coverage can be performed in which a titanium film is formed on only a bottom of a vertical contact hole formed on the wafer 30, and is not formed on a wall of the contact hole.

If a rate of a metal film formed by neutral metal atoms incident on the wafer 30 with a great angular spread is higher than that of a metal film formed by metal ions incident on the wafer 30 perpendicularly, vertical growth is poor so that the bottom coverage is deteriorated.

More specifically, the metal film is formed on the wall of the contact hole as well as the bottom portion thereof. Consequently, the contact hole is blocked.

The neutral metal atoms which cause the above-mentioned state exist in the plasma AP. As described above, the neutral metal atoms are supplied from the sputtering target 22. However, about several percent of the neutral metal atoms are ionized. Accordingly, the neutral metal atoms exist more than the metal ions in the plasma AP.

While all the neutral metal atoms are not incident on the wafer 30, at least the neutral metal atoms having a speed component in a wafer direction are incident on the wafer 30. The ionized PVD device 90 described above does not have a structure in which the neutral metal atoms are prevented from being incident on the wafer 30.

If an ionization ratio of the neutral metal atoms can be increased rapidly, an influence of the neutral metal atoms can be reduced. However, the high-frequency coil 21 incorporated in the ionized PVD device 90 is not perfect. A mechanism for producing a plasma by arc discharge and a structure for supplying the neutral metal atoms by a method other than sputtering should be required so that a structure of a device becomes complicated.

SUMMARY OF THE INVENTION

A first aspect of the present invention is directed to an ionized PVD device comprising a vacuum chamber having an almost S-shaped contour shape, both ends of which define first and second openings, wherein a semiconductor substrate is provided in a first opening side, a sputtering target provided in a second opening side, plasma producing means for setting the sputtering target and the vacuum chamber to negative and positive electrodes respectively and producing a plasma between the electrodes, bias voltage applying means for applying a bias voltage to the semiconductor substrate, and magnetic field forming means provided on an outside of the vacuum chamber so as to form an almost S-shaped magnetic field in the vacuum chamber along a shape of the vacuum chamber, wherein the vacuum chamber has a set of bent portions which are bent in opposite directions to each other so that the first and second openings are not opposed to each other.

A second aspect of the present invention is directed to the ionized PVD device, wherein the magnetic field forming means comprises a plurality of air-core coils, and a power supply for supplying a current to the air-core coils, the air-core coils being provided so as to surround at least the set of bent portions of the vacuum chamber.

A third aspect of the present invention is directed to the ionized PVD device, wherein the magnetic field forming means comprises an integral air-core coil formed by winding a coil material around an external wall of the vacuum chamber along the shape of the vacuum chamber, and a power supply for supplying a current to the integral air-core coil.

A fourth aspect of the present invention is directed to the ionized PVD device, further comprising a first removable cover capable of blocking the first opening of the vacuum chamber, a second removable cover capable of blocking the second opening of the vacuum chamber, and first and second electric insulators provided between the first and second covers and the vacuum chamber for electrically insulating the first and second covers from the vacuum chamber, wherein the semiconductor substrate is attached to the first cover, and the sputtering target is attached to the second cover.

A fifth aspect of the present invention is directed to the ionized PVD device, wherein the bias voltage applying means comprises a high-frequency power supply having a first output terminal electrically connected to the first cover and a second output terminal connected to a ground potential, and a capacity element provided between the first cover and the first output of the high-frequency power supply for insulating in a DC manner the semiconductor substrate.

A sixth aspect of the present invention is directed to the ionized PVD device, further comprising neutral particle trapping means provided along an internal wall of the vacuum chamber for trapping neutral particles in the plasma, the neutral particle trapping means comprising a plurality of metal plates, each metal plate having an opening having a predetermined size in a central portion, and a plurality of tubelike flexible plates for connecting the metal plates to form an array of the metal plates.

A seventh aspect of the present invention is directed to a method for manufacturing a semiconductor device, comprising the steps of preparing the ionized PVD device according to the first aspect of the present invention, exhausting air in the vacuum chamber to reduce a pressure of the vacuum chamber to a first pressure, introducing at least one kind of gas into the vacuum chamber to raise the pressure of the vacuum chamber to a second pressure, applying a DC voltage across the sputtering target and the vacuum chamber as negative and positive electrodes respectively to produce a plasma of the at least one kind of gas, applying a bias voltage from the bias voltage applying means to the semiconductor substrate, and forming an almost S-shaped magnetic field in the vacuum chamber by the magnetic field forming means along the shape of the vacuum chamber, wherein a predetermined film including a material of the sputtering target as a principal material is formed on the semiconductor substrate.

An eighth aspect of the present invention is directed to the method for manufacturing a semiconductor device, wherein the semiconductor substrate has at least one contact hole formed perpendicularly to a major surface of the semiconductor substrate, and the predetermined film is formed on a bottom of the at least one contact hole and functions as a barrier metal.

A ninth aspect of the present invention is directed to the method for manufacturing a semiconductor device, wherein the at least one kind of gas includes a nitrogen gas or an ammonia gas, and the film which functions as a barrier metal is formed of a nitride film including the material of the sputtering target as a principal material.

According to the first aspect of the present invention, the almost S-shaped vacuum chamber having a structure in which the first and second openings are not opposed to each other is used to form the almost S-shaped magnetic field in the vacuum chamber according to the shape thereof. Consequently, neutral atoms of a sputtering target material which are emitted by sputtering performed by ions of a plasma formed in the vacuum chamber can be prevented from being incident on the semiconductor substrate. Therefore, it is possible to increase a rate at which the ions of the sputtering target material accelerated perpendicularly by the applied bias voltage are incident on the semiconductor substrate. Thus, an ionized PVD device capable of performing film formation having excellent vertical growth can be provided. Accordingly, a desired film is formed on only a bottom of a contact hole of the semiconductor substrate and is not formed on a wall of the contact hole, for example. Thus, it is possible to perform film formation having excellent bottom coverage. Furthermore, the vacuum chamber has a set of bent portions which are bent in opposite directions to each other and is almost S-shaped. Consequently, it is possible to eliminate an offset of a plasma caused by an E×B drift of the plasma due to existence of an electric field and a magnetic field so that a plasma density becomes uniform in the vicinity of the semiconductor substrate. Thus, it is possible to obtain the ionized PVD device capable of performing uniform film formation. In addition, the plasma produced by general DC discharge is used. Consequently, a structure of a device for plasma production is comparatively simple. Even if the magnetic field forming means is required, manufacturing cost of the device can be inhibited from being increased.

According to the second aspect of the present invention, the almost S-shaped magnetic field is formed by causing a current to flow to the air-core coils provided so as to surround at least one set of bent portions of the vacuum chamber. Consequently, arrangement of the air-core coils is changed so that a shape of the magnetic field can be varied. Even if the state of the plasma is changed, the plasma density can be kept optimum in the vicinity of the semiconductor substrate.

According to the third aspect of the present invention, the almost S-shaped magnetic field is formed by causing a current to flow to the integral air-core coil. Consequently, it is possible to form a magnetic field which corresponds to the shape of the vacuum chamber.

According to the fourth aspect of the present invention, the first and second covers are attached or removed so that the semiconductor substrate and the sputtering target can be varied easily. Furthermore, it is possible to obtain a specific structure in which the semiconductor substrate and the sputtering target are electrically insulated from the vacuum chamber.

According to the fifth aspect of the present invention, a bias voltage is applied to the semiconductor substrate at a high frequency. Consequently, a DC electric field induced by a high-frequency voltage is formed between a surface of the semiconductor substrate and the plasma, and ions accelerated by the DC electric field can be incident on the semiconductor substrate almost perpendicularly. In addition, the semiconductor substrate can be insulated to prevent a DC current from flowing. Therefore, a plasma current (DC current) can be prevented from flowing to a high-frequency power supply side through the semiconductor substrate so that the semiconductor substrate can be prevented from being damaged by the plasma current.

According to the sixth aspect of the present invention, the neutral particles in the plasma can surely be prevented from reaching the semiconductor substrate. In addition, the neutral particle trapping means can be provided also in the bent portion of the vacuum chamber because it can vary a shape of the array of the metal plates. Thus, an effect of trapping the neutral particles can be enhanced.

According to the seventh aspect of the present invention, the ionized PVD device is used wherein the neutral atoms of the sputtering target material which are emitted by sputtering performed by the ions of the plasma formed in the vacuum chamber can be prevented from being incident on the semiconductor substrate and it is possible to increase a rate at which the ions of the sputtering target material accelerated perpendicularly by the applied bias voltage are incident on the semiconductor substrate so that film formation having excellent vertical growth can be performed. Consequently, the predetermined film including the material of the sputtering target as a principal material can be formed on the semiconductor substrate perpendicularly.

According to the eighth aspect of the present invention, the film which functions as a barrier metal is formed on the bottom of at least one contact hole formed perpendicularly to the principal plane of the semiconductor substrate. Thus, a semiconductor device which requires the barrier metal can be obtained.

According to the ninth aspect of the present invention, the film which functions as the barrier metal can be obtained.

In order to eliminate the above-mentioned problems, it is an object of the present invention to provide an ionized PVD device capable of performing film formation having excellent vertical growth, and more particularly provide an ionized PVD device having a comparatively simple structure in which a rate of a metal film formed by neutral metal atoms can be reduced in a contact hole of a semiconductor substrate to perform film formation having excellent bottom coverage, and to provide a method for manufacturing a semiconductor device using the ionized PVD device.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. Embodiment>

<1. Structure of Device>

Figure 1:
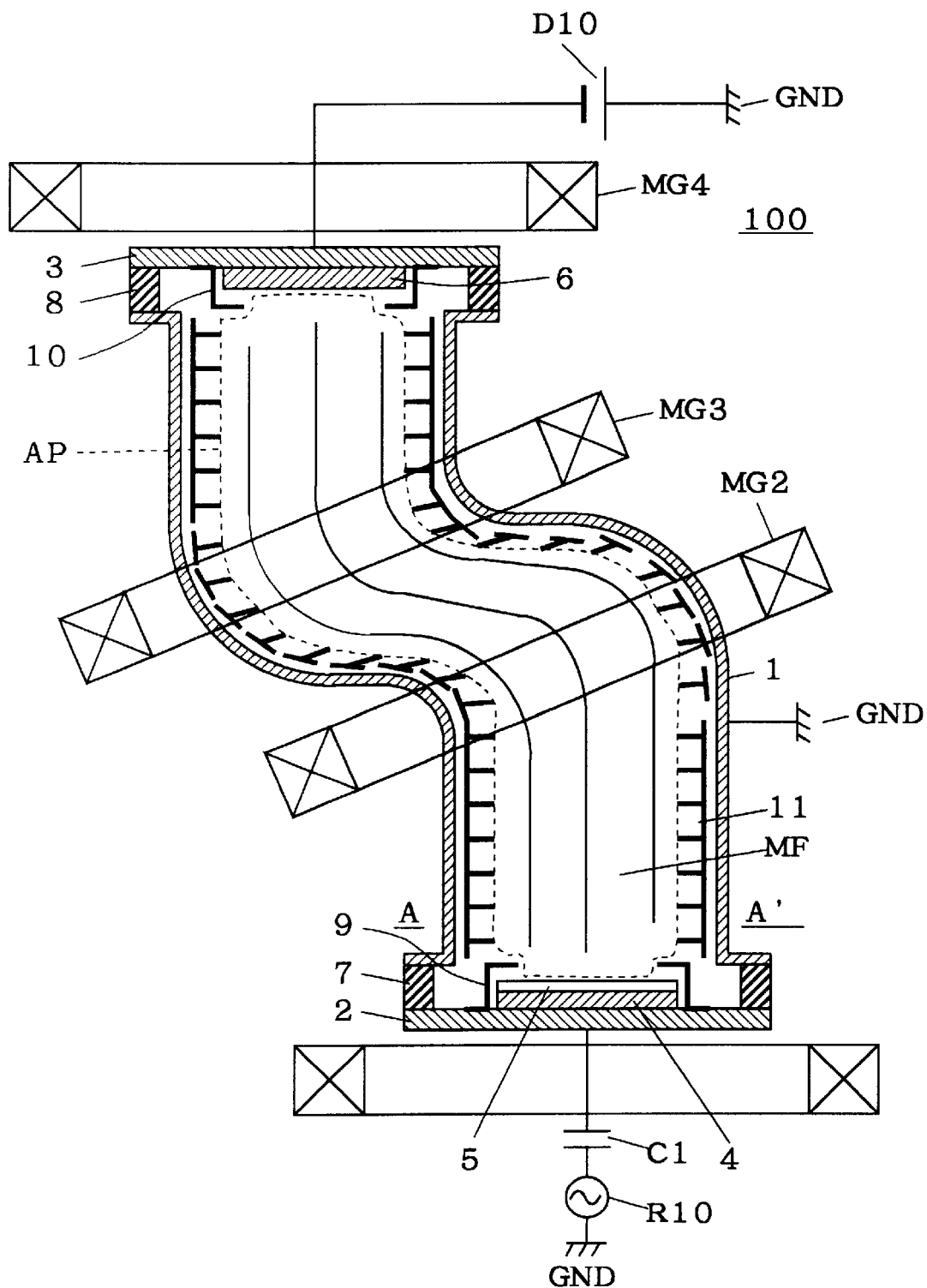
FIG. 1 is a sectional view showing a schematic structure of an ionized PVD device according to an embodiment of the present invention.

FIG. 1 shows an ionized PVD (Physical Vapour Deposition) device 100 according to an embodiment of the present invention.

FIG. 1 is a schematically sectional view for explaining a structure of the ionized PVD device 100. As shown in FIG. 1, the ionized PVD device 100 comprises a vacuum chamber 1 having an almost S-shaped contour shape. Both ends of the vacuum chamber 1 form openings (first and second openings) which are sealed by first and second covers 2 and 3, respectively. For example, a wafer susceptor 4 for mounting a semiconductor substrate 5 (hereinafter referred to as a wafer) thereon is attached to a vacuum chamber 1 side of the first cover 2, and a sputtering target 6 is attached to the vacuum chamber 1 side of the second cover 3.

The wafer 5 is mounted on the wafer susceptor 4. The wafer susceptor 4 serves to apply a high-frequency bias to the wafer 5, and is connected to a high-frequency power supply R10 through the first cover 2. The first cover 2 is electrically insulated from the vacuum chamber 1 by an electric insulator 7, and a capacitor C1 is electrically provided between the first cover 2 and the high-frequency power supply R10.

The sputtering target 6 is electrically connected to a negative output terminal of a DC power supply D10 through the second cover 3. The second cover 3 is electrically insulated from the vacuum chamber 1 by an electric insulator 8. The vacuum chamber 1 is electrically connected to a ground potential GND.

Peripheral portions of the wafer susceptor 4 and the sputtering target 6 are covered with dark space shields 9 and 10, respectively. The dark space shields 9 and 10 serve to prevent the first cover 2 and the second cover 3 provided in the vicinity of the peripheral portions of the wafer susceptor 4 and the sputtering target 6 from being exposed to a plasma which will be described below in order for metals forming the first cover 2 and the second cover 3 not to be mixed into the plasma.

In FIG. 1, air-core coils MG1 to MG4 (magnetic field forming means) are provided on an outside of the vacuum chamber 1 concentrically with a central axis of the vacuum chamber 1 and an extension axis of the central axis. The air-core coils MG1 to MG4 are electromagnets for forming an S-shaped magnetic field MF in the chamber vacuum 1 almost along a contour shape thereof. The air-core coils MG1 and MG4 are provided so as to form the magnetic field in a straight portion in the vicinity of the both ends of the vacuum chamber 1, and the air-core coils MG2 and MG3 are provided so as to form the magnetic field in a bent portion of the vacuum chamber 1. The air-core coils MG1 to MG4 are connected to a DC power supply, which is not shown.

<1-1. Example of Arrangement of Air-core Coil>

While each of the air-core coils MG1 to MG4 is shown as a single coil in the ionized PVD device 100 in FIG. 1, the single coil is not always provided for each of them. For example, the single coil cannot always form a magnetic field along a shape of the bent portion of the vacuum chamber 1. In such a case, a plurality of coils are provided according to the shape of the bent portion in place of the air-core coils MG2 and MG3. An example of arrangement of this case is shown in FIG. 2.

Figure 2:
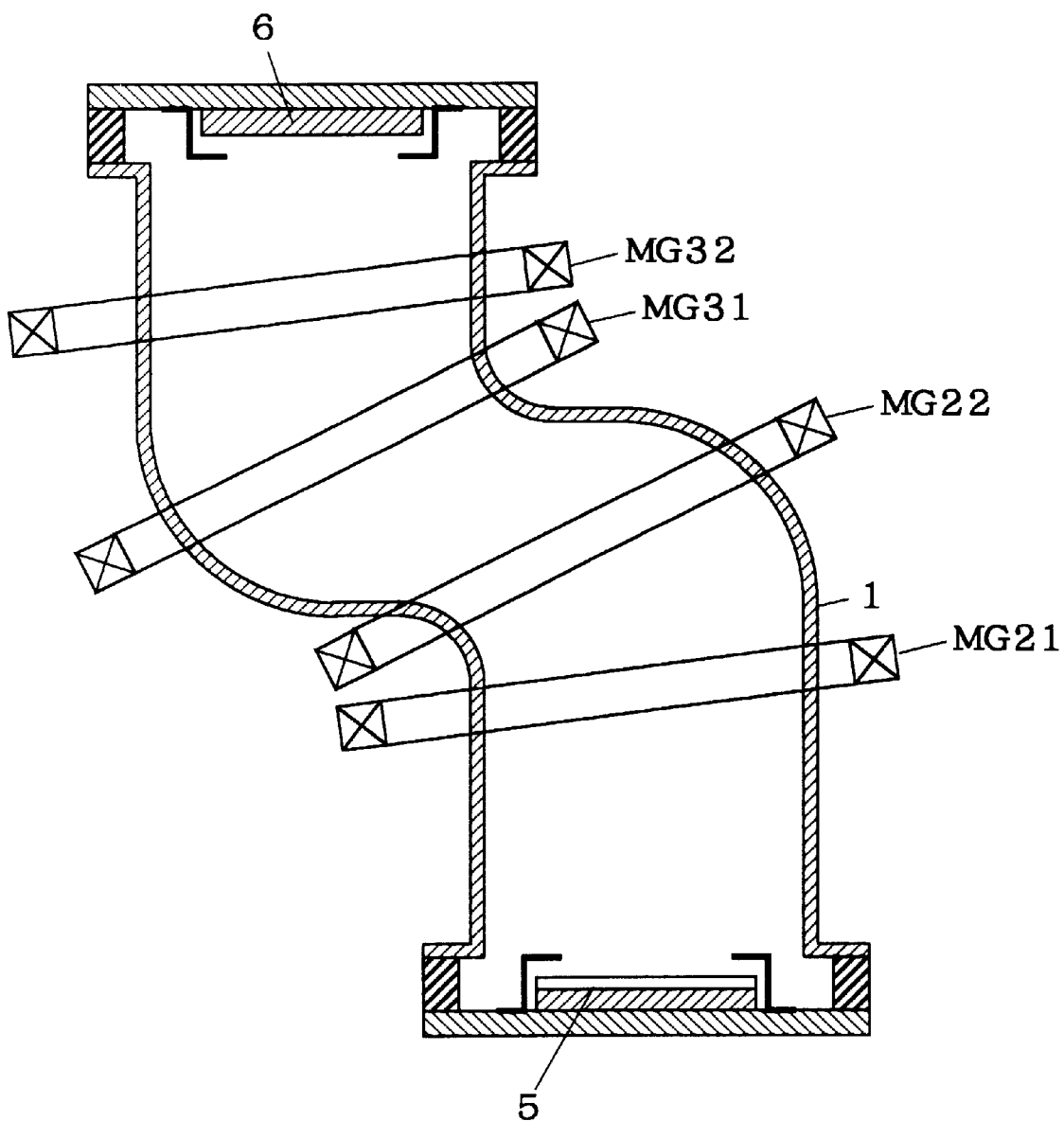
FIG. 2 is a view for explaining an example of arrangement of air-core coils according to the embodiment of the present invention.

In FIG. 2, air-core coils MG21 and MG22 are provided in place of the air-core coil MG2, and air-core coils MG31 and MG32 are provided in place of the air-core coil MG3.

While the air-core coils MG1 and MG4 are provided concentrically with the extension axis of the central axis of the vacuum chamber 1 in FIG. 1, it is apparent that the air-core coils may be provided concentrically with the central axis of the vacuum chamber 1 (so as to surround the vacuum chamber 1).

Figure 3:
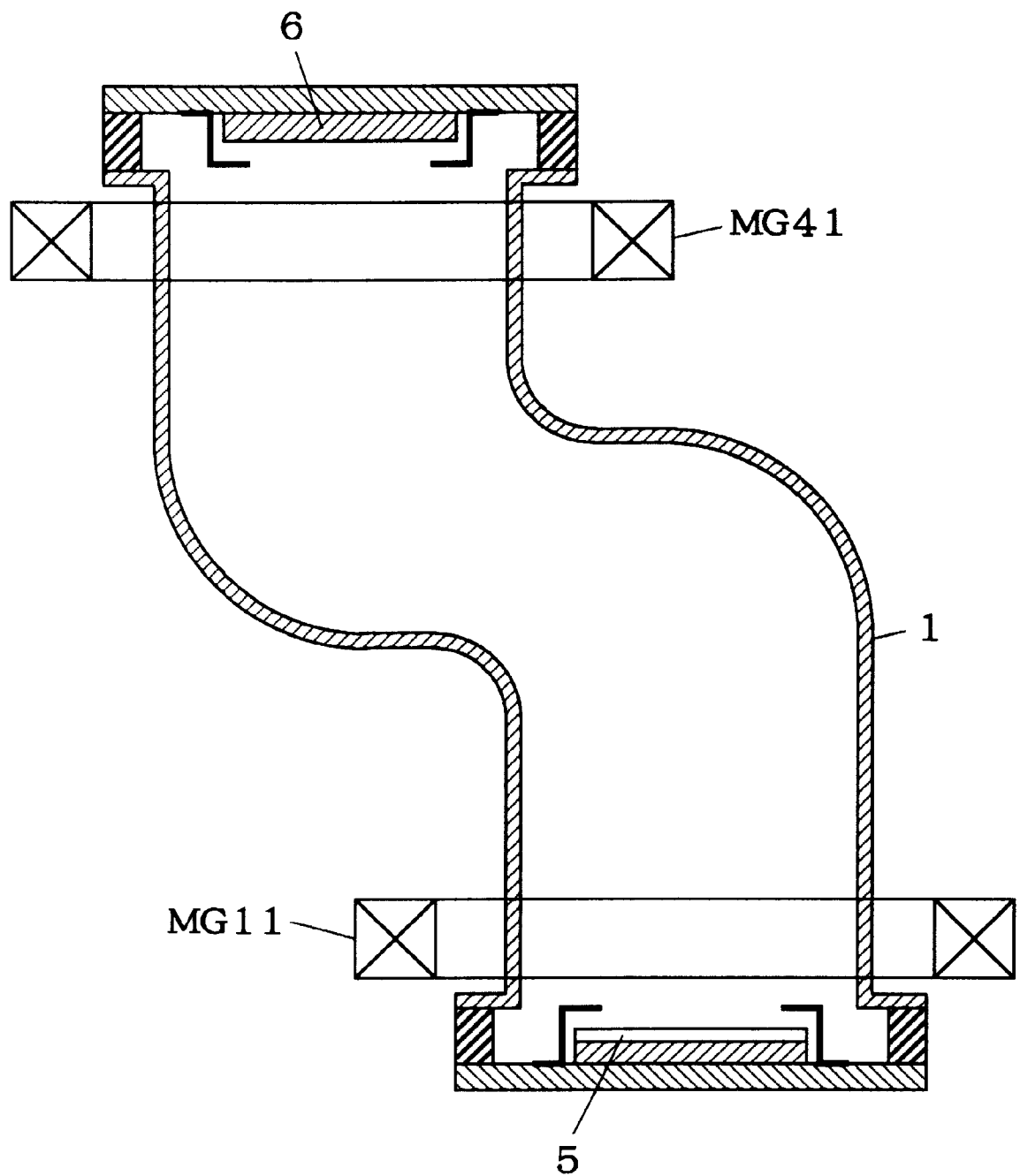
FIG. 3 is a view for explaining an example of the arrangement of the air-core coils according to the embodiment of the present invention.

In other words, the air-core coils MG11 and MG41 may be provided so as to surround the straight portion in the vicinity of the both ends of the vacuum chamber 1 as shown in FIG. 3.

Figure 4:
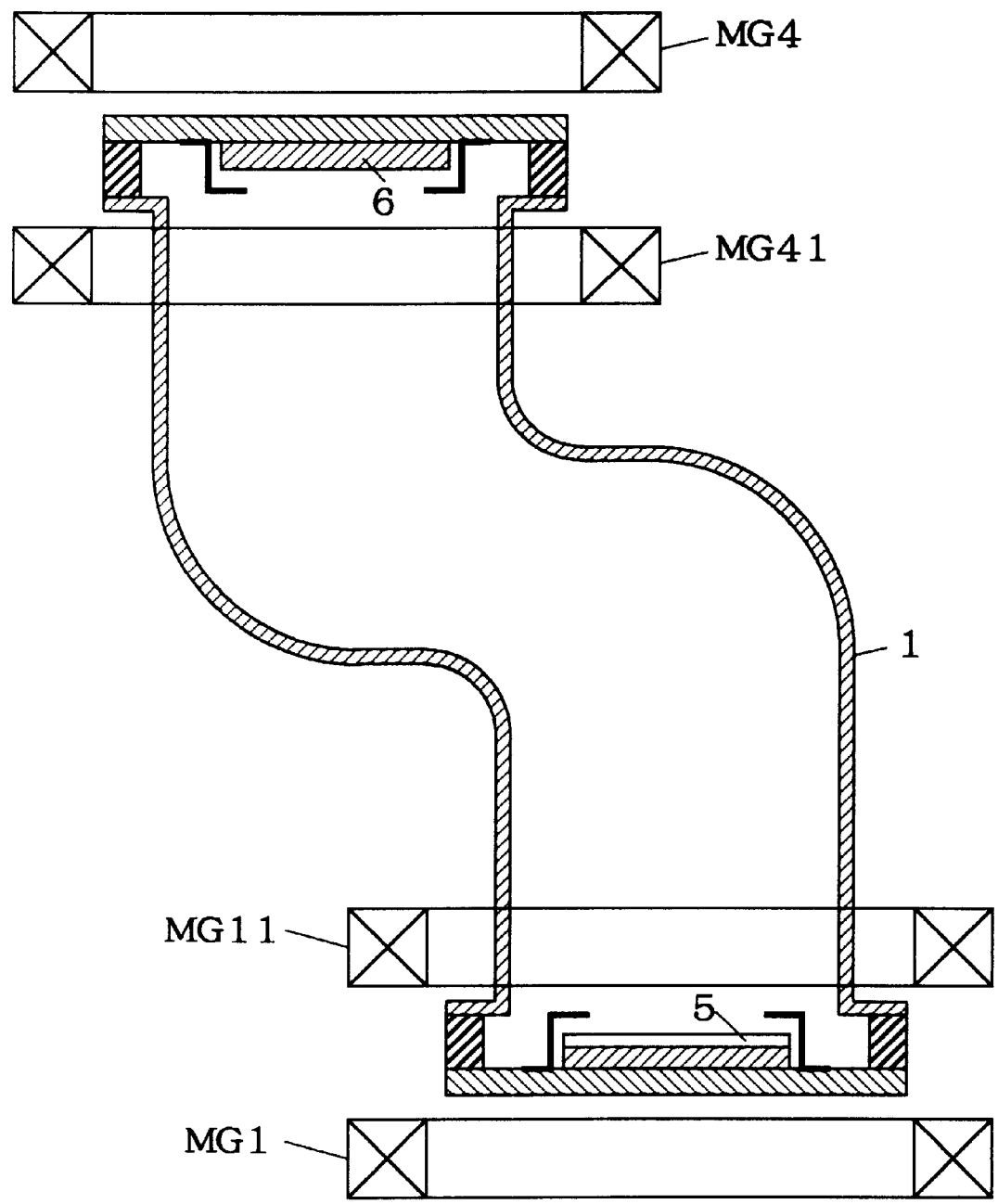
FIG. 4 is a view for explaining an example of the arrangement of the air-core coils according to the embodiment of the present invention.

As shown in FIG. 4, the air-core coils MG11 and MG41 may be provided together with the air-core coils MG1 and MG4.

Since a magnetic field is formed by a plurality of air-core coils, the arrangement of the air-core coils is changed so that a shape of the magnetic field can be varied and can correspond to a change in the state of the plasma.

<1-2. Example of Structure of Neutral Particle Trap>

A section of the vacuum chamber 1 taken along the line A-A' of FIG. 1 is ring-shaped, and has an inside diameter of about 300 mm. A neutral particle trap 11 (neutral particle trapping means) is provided along an internal wall of the vacuum chamber 1.

Figure 5:
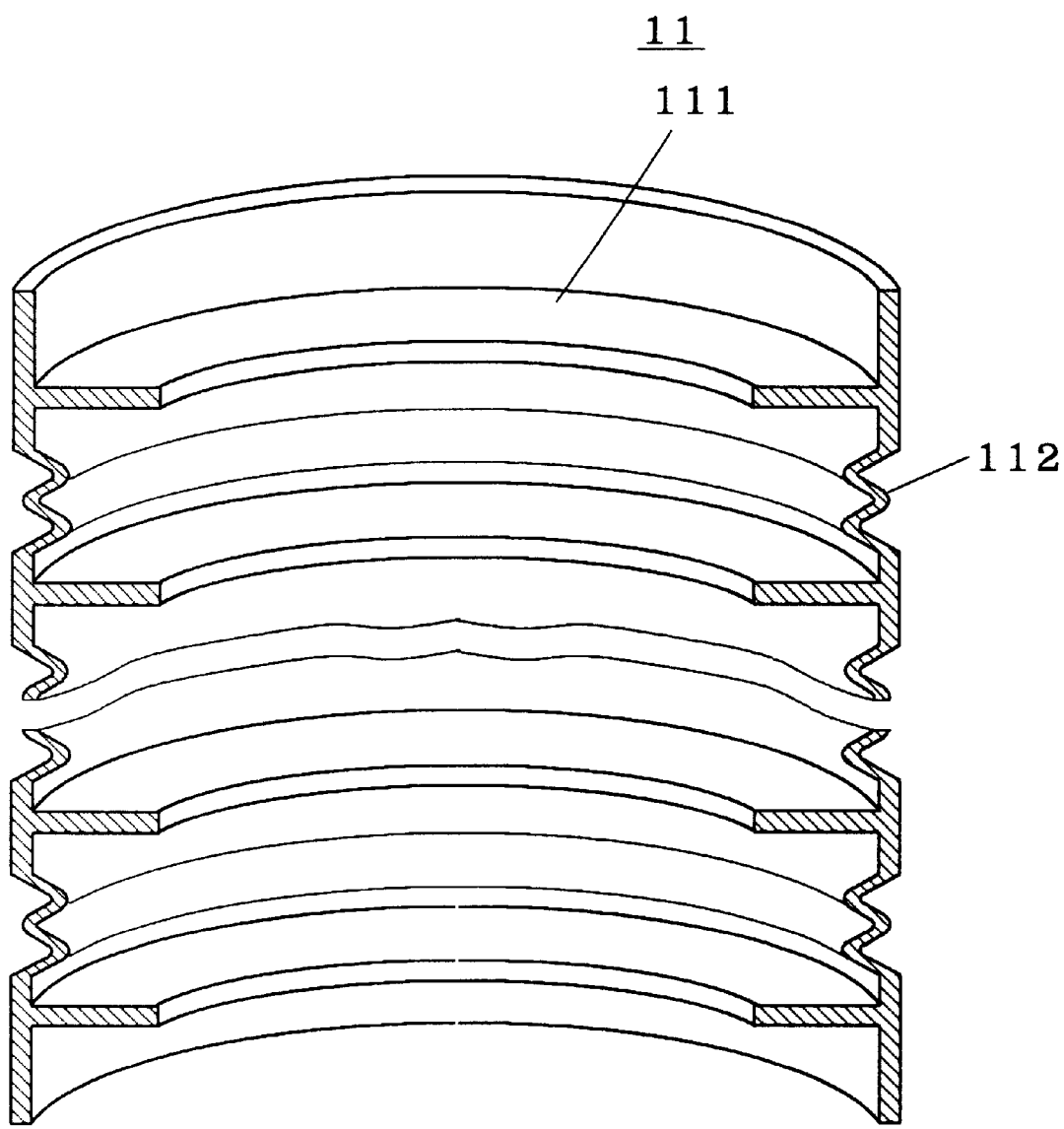
FIG. 5 is a view for explaining a structure of a neutral particle trap according to the embodiment of the present invention.

FIG. 5 is a perspective view showing a section according to an example of a shape of the neutral particle trap 11. As shown in FIG. 5, the neutral particle trap 11 includes a plurality of metal rings 111, each having an inside diameter of 200 mm, an outside diameter of 300 mm, and a thickness of about 0.2 mm, and a plurality of tubular flexible plates 112 for connecting principal planes of the metal rings 111 to form an array of the metal rings 111. Accordingly, the neutral particle trap 11 can be deformed freely, and is inserted in the vacuum chamber 1 so that the metal rings 111 can be provided on a wall of the bent portion of the vacuum chamber 1 as well as a wall of the straight portion thereof.

While the section of the vacuum chamber 1 is ring-shaped as described above, it may be rectangular. In that case, the neutral particle trap 11 also has a rectangular shape, and the metal rings 111 and the flexible plates 112 also have rectangular shapes.

<2. Operation of Device>

Operation of the ionized PVD device 100 will be described below with reference to FIGS. 1 and 6.

Figure 6:
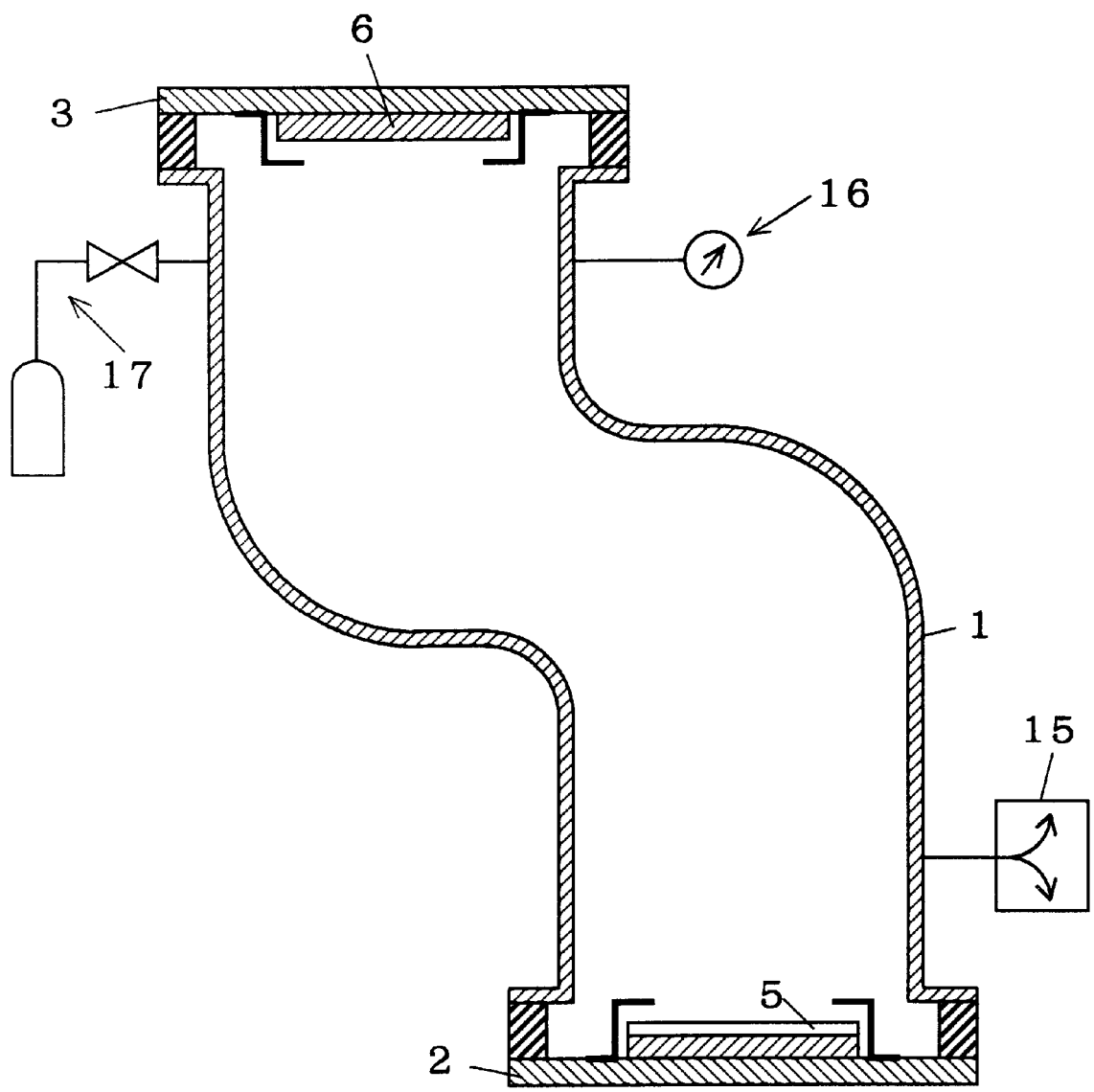
FIG. 6 is a view showing an example of arrangement of a vacuum equipment and a gas introducing equipment according to the embodiment of the present invention.

FIG. 6 is a view showing an example of arrangement of a vacuum equipment and a gas introducing equipment of the ionized PVD device 100.

First of all, the first cover 2 and the second cover 3 are attached to the vacuum chamber 1 to seal the vacuum chamber 1. The first cover 2 has the wafer 5 attached to the wafer susceptor 4. The second cover 3 has the sputtering target 6 attached thereto.

Then, air in the vacuum chamber 1 is exhausted by a vacuum exhausting device 15 shown in FIG. 6 to reduce a pressure of the vacuum chamber 1 to about $1 \times 10^{-7}$ Torr (a first pressure) while monitoring a vacuum measuring device 16. Then, a rare gas having a high sputtering rate such as an argon gas is introduced from a gas introducing system 17 to the vacuum chamber 1 while monitoring the vacuum measuring device 16 to raise a pressure of the vacuum chamber 1 to about $2 \times 10^{-3}$ Torr (a second pressure).

The sputtering target 6 is electrically connected to the negative output terminal of the DC power supply D10 through the second cover 3. For this reason, when a voltage is applied from the DC power supply D10, the sputtering target 6 functions as a cathode. Since the vacuum chamber 1 is connected to the ground potential, it functions as an anode. When an output voltage of the DC power supply D10 reaches about −500 V, a plasma AP is produced in the vacuum chamber 1. Since the plasma cannot be shown precisely, a region where the plasma is formed is shown in a broken line, which will be hereinafter referred to as the plasma AP.

As shown in FIG. 1, the capacitor C1 is electrically provided between the first cover 2 and the high-frequency power supply R10. Consequently, a current (DC current) of the plasma AP can be prevented from flowing to a high-frequency power supply R10 side through the wafer 5. Thus, the wafer 5 can be prevented from being damaged by the plasma current.

Argon ions mainly form the plasma AP. The argon ions collide with the sputtering target 6 which acts as a negative potential, and sputter a component of the sputtering target 6, for example, titanium (Ti) as neutral atoms or titanium ions. A material of the sputtering target 6 is determined according to a composition of a desired film to be formed on the wafer 5 which will be described below.

The neutral atoms or ions of titanium sputtered from the sputtering target 6 enter the plasma AP. A part of the neutral atoms are ionized by electrons in the plasma AP, are trapped in a magnetic line of force of an S-shaped magnetic field MF formed by causing a current to flow from a power supply which is not shown to the air-core coils MG1 and MG2, and are led to the wafer 5.

The magnetic field MF has a function of leading the titanium ions to the wafer 5 and of inhibiting the plasma AP from diffusing toward the wall of the vacuum chamber 1, that is, confining the plasma AP to increase a density (an ionization degree) of the plasma AP.

On the other hand, since the neutral atoms of titanium which have not been ionized are not trapped in the magnetic line of force, they fly straight in almost the same direction as a direction in which they are sputtered from the sputtering target 6, and are incident on the neutral particle trap 11 provided on the walls of the vacuum chamber 1 and are trapped therein.

The vacuum chamber 1 is S-shaped, and has a structure in which the first and second openings are not opposed to each other and the sputtering target 6 is not opposed to the wafer 5. Consequently, a rate at which the neutral atoms of titanium are incident on the wafer 5 is reduced.

More specifically, the neutral atoms of titanium sputtered at an almost right angle to the sputtering target 6 are trapped in the neutral particle trap 11 in the bent portion of the vacuum chamber 1, and most of the neutral atoms of titanium sputtered from the sputtering target 6 at other angles are trapped in the neutral particle trap 11 in the straight portion in the vicinity of the both ends of the vacuum chamber 1. Consequently, the neutral atoms of titanium can be prevented from being incident on the wafer 5.

A wafer-plasma DC electric field which is induced by a high-frequency voltage applied from the high-frequency power supply R10 to the wafer 5 through the wafer susceptor 4 is present between a surface of the wafer 5 and the plasma AP. For this reason, the titanium ions trapped in the magnetic line of force forming the S-shaped magnetic field MF and led to the wafer 5 are accelerated by the DC electric field and are incident on the wafer 5 almost perpendicularly.

While the titanium ions are incident on the wafer 5 almost perpendicularly, the neutral atoms of titanium are prevented from being incident on the wafer 5 as described above. Consequently, film formation having excellent bottom coverage can be performed in which a titanium film is formed on only a bottom of a vertical contact hole formed on the wafer 5 and is not formed on a wall of the contact hole.

<2-1. Positioning of Ionized PVD Device in Manufacture of Semiconductor Device>

The titanium film formed on only the bottom of the contact hole functions as a barrier metal. More specifically, in the case where the bottom of the contact hole is an exposed surface of a silicon semiconductor layer and a wiring layer of aluminum (Al) is buried in the hole, for example, nonconformity is caused on the silicon semiconductor layer and the aluminum wiring layer by mutual invasion of the aluminum and silicon when the aluminum directly comes in contact with the silicon semiconductor layer. The titanium film can prevent such nonconformity.

Tungsten (W), titanium nitride (TiN), tungsten titanium (TiW) and the like can also be used as the barrier metal. A material of the sputtering target 22 and the kind of a gas to be introduced can be changed according to a desired barrier metal.

For example, a nitride gas (a nitrogen gas or an ammonia gas) is introduced together with the argon gas from the gas introducing system 17 shown in FIG. 6 to produce a plasma comprising argon ions and nitrogen ions as principal components so that a titanium nitride film can be formed on the bottom of the contact hole.

After the titanium film is formed on the bottom of the contact hole, the wafer 5 is annealed in the nitride gas (the nitrogen gas or the ammonia gas) so that the titanium nitride film can be formed on the bottom of the contact hole by chemical reaction.

After the titanium film is formed on the bottom of the contact hole, the wafer 5 is put into a vacuum chamber for annealing and is then annealed. In that case, the vacuum chamber for annealing is connected to the vacuum chamber 1 shown in FIG. 1 to carry the wafer 5 under vacuum such that the wafer 5 is not exposed to an oxygen atmosphere (atmospheric air).

While the vacuum chamber for annealing includes a halogen lamp, a xenon flash lamp or the like for heating the wafer 5, an annealing method itself is general and its detailed description will be omitted.

The vacuum chamber for annealing may be connected to an extension chamber which is connected to the electric insulator 7, or may be connected to a connection opening provided on a wall of the electric insulator 7.

<2-2. Function and Effect of S-shaped Magnetic Field>

Another function and effect obtained by the S-shaped vacuum chamber and magnetic field will be described below. Since the S-shaped vacuum chamber 1 has a structure in which the sputtering target 6 is not opposed to the wafer 5, a rate at which the neutral atoms of titanium are incident on the wafer 5 can be reduced. Such a structure can have a shape other than the S-shape, for example, an L-shape or a J-shape.

Figure 7:
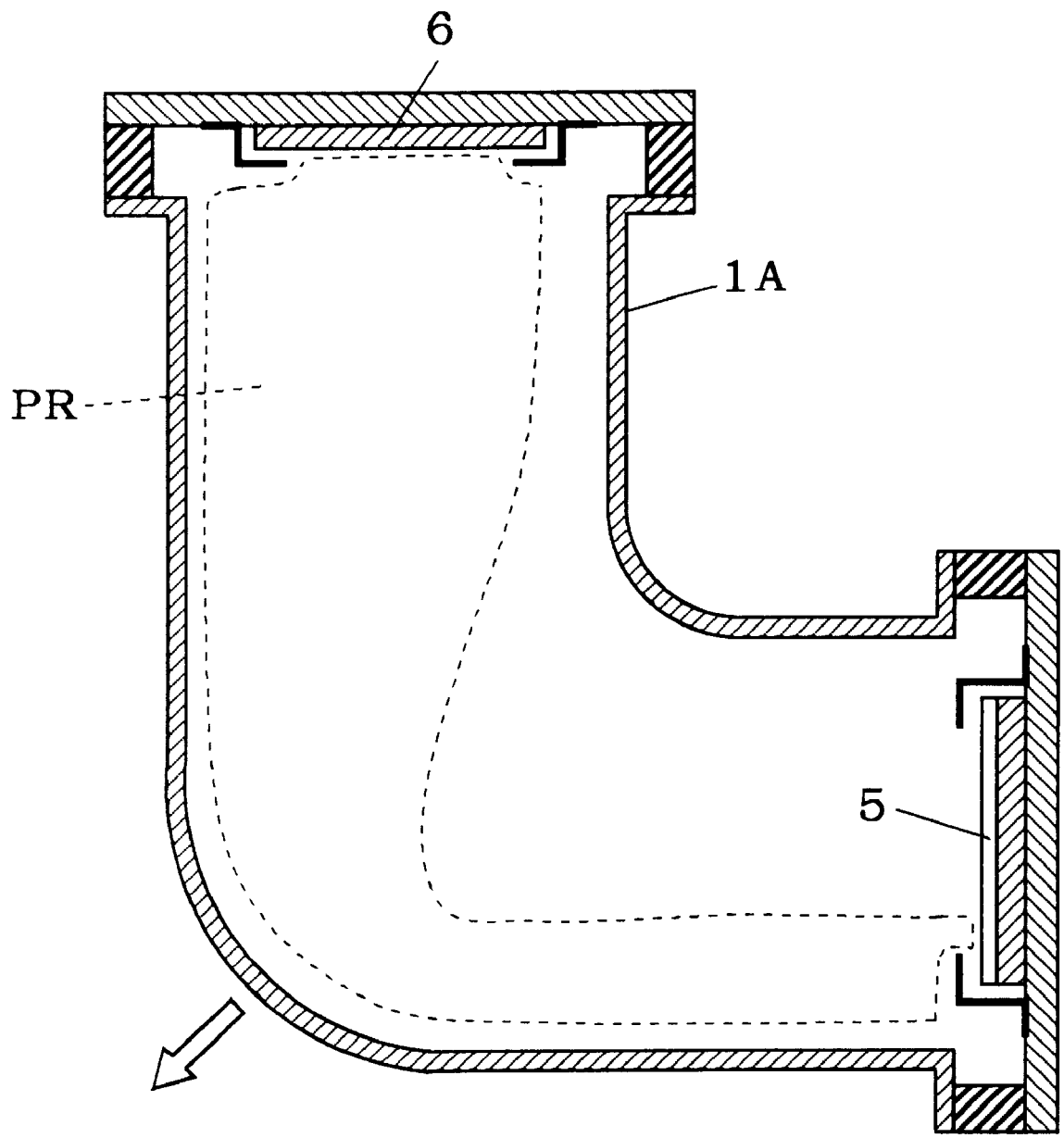
FIG. 7 is a typical view for explaining an offset of a plasma.

FIG. 7 shows a vacuum chamber 1A having an L-shaped contour shape. If the sputtering target 6 and the wafer 5 are provided on both ends of the vacuum chamber 1A, the sputtering target 6 is not opposed to the wafer 5. However, such a structure has the following problems.

More specifically, a magnetic field is weakened toward a radial outside of a bent portion of the vacuum chamber 1A, that is, in a direction of an arrow shown in FIG. 7. Thus, a magnetic field grade is produced. When the magnetic field grade is generally present, a drift phenomenon in which charged particles move at a right angle to the magnetic field grade is generated. A moving direction is varied depending on polarity of the charged particles. A charge separation phenomenon is generated in which positive charged particles, that is, ions separate from negative charged particles, that is, electrons. Consequently, an electric field is formed.

When the electric field and the magnetic field are present, the ions and the electrons drift in one direction perpendicular to both the electric field and the magnetic field (an E×B drift). The magnetic field is weakened in the same direction shown by the arrow in FIG. 7.

Moving of the ions and the electrons means that of a plasma. In other words, a density distribution of the plasma is deviated on the radial outside of the bent portion of the vacuum chamber 1A. FIG. 7 typically shows, in a broken line, a plasma region PR having a high density.

When the wafer 5 is exposed to the plasma having the deviated density distribution, a thick metal film is formed in a portion exposed to the plasma having a high density and a thin metal film is formed in a portion exposed to the plasma having a low density. Thus, uniform film formation cannot be performed.

Figure 8:
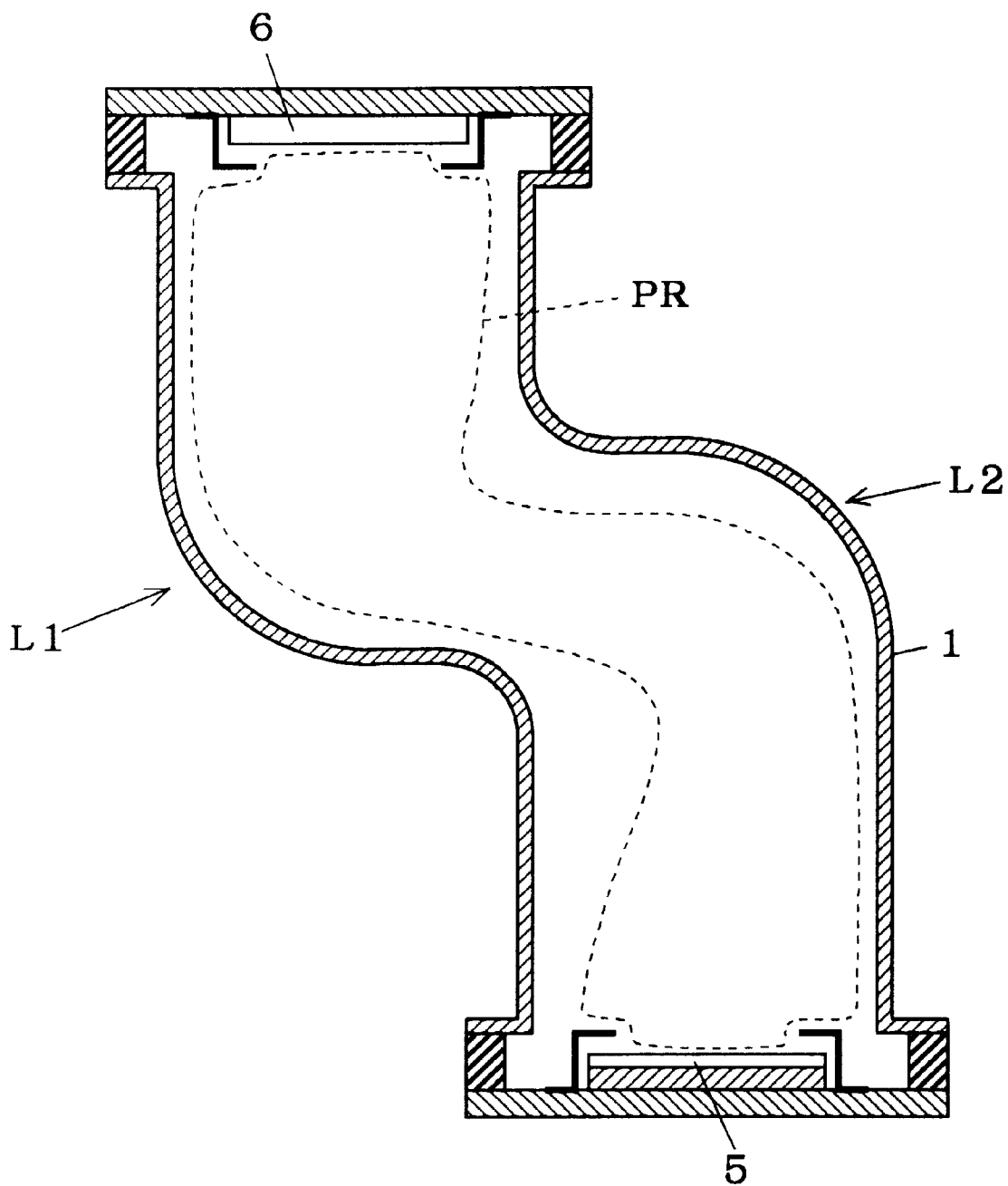
FIG. 8 is a typical view for explaining an offset of a plasma according to the embodiment of the present invention.
Figure 9:
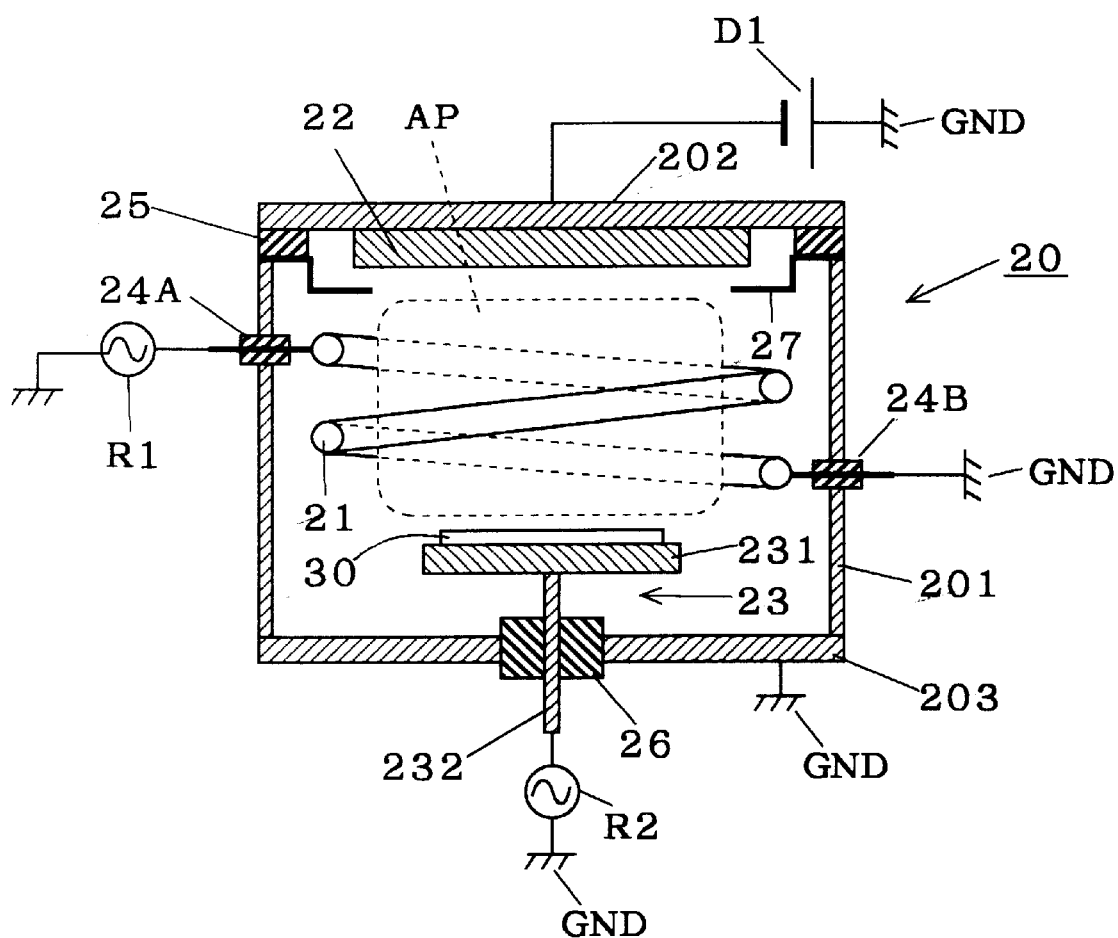
FIG. 9 is a sectional view showing a schematic structure of an ionized PVD device according to the prior art.

An S-shaped vacuum chamber 1 can eliminate the above-mentioned problem. FIG. 8 typically shows, in a broken line, a plasma region PR having a high density in the S-shaped vacuum chamber 1.

As shown in FIG. 8, an offset of the plasma produced in a first bent portion L1 of the vacuum chamber 1 (which is closer to the sputtering target 6) is moved in an opposite direction in a second bent portion L2. In that case, the deviation of the plasma density is eliminated and the distribution becomes almost uniform in the vicinity of the wafer 5. Accordingly, uniform film formation can be performed in the wafer 5.

Thus, the almost S-shaped vacuum chamber is used to form an almost S-shaped magnetic field so that an ionized PVD device can be obtained in which the plasma density is uniform in the vicinity of the wafer and uniform film formation can be performed. Shapes of the vacuum chamber and the magnetic field are not restricted to an almost S-shape. If the numbers of the portions bent in opposite directions to each other are the same and the bent portions are arranged such that the deviation of the plasma density therein can be eliminated, the same effects can be obtained.

<3. Characteristic Function and Effect>

According to the ionized PVD device of the present invention described above, the neutral atoms of the metal supplied from the sputtering target are prevented from being incident on the wafer (semiconductor substrate). Consequently, it is possible to perform film formation having excellent vertical growth and bottom coverage in which a desired film is formed on only the bottom of the vertical contact hole formed on the wafer and is not formed on the wall of the contact hole.

The S-shaped vacuum chamber is used to form the S-shaped magnetic field. Thus, it is possible to obtain the ionized PVD device in which the offset of the plasma in the bent portion is eliminated, the plasma density is uniform in the vicinity of the wafer and uniform film formation can be performed.

Furthermore, since a plasma produced by general DC discharge is used, a structure of the device for plasma production is comparatively simple. Also in the case where the air-core coil is used, manufacturing cost of the device can be inhibited from being increased.

<B. Variant of Embodiment>

While a structure in which a plurality of air-core coils form the S-shaped magnetic field has been described in the embodiment according to the present invention, the S-shaped magnetic field may be formed by a single air-core coil.

More specifically, the S-shaped magnetic field may be formed by an integral air-core coil formed by using an external wall of a vacuum chamber 1 as a core and winding a coil material around the external wall of the vacuum chamber 1 according to a shape thereof.

With such a structure, the S-shaped magnetic field which corresponds to the shape of the vacuum chamber 1 can be formed.

The coil material may be directly wound onto the external wall of the vacuum chamber 1, or may be wound onto the external wall of the vacuum chamber 1 through some insulating material.

In the case where the integral air-core coil is used, it is necessary to form a structure in which a gas introducing port, a vacuum exhausting port and a vacuum measuring port are not provided in the vacuum chamber 1. For this purpose, another vacuum chamber having the gas introducing port, the vacuum exhausting port and the vacuum measuring port in place of the first cover 2 or the second cover 3 may be connected. In that case, the wafer 5 or the sputtering target 6 is provided in the vicinity of a connecting portion of another vacuum chamber to the vacuum chamber 1.

While the structure in which the metal film having excellent vertical growth is formed on the bottom of the contact hole of the semiconductor substrate has been described in the embodiment according to the present invention, application of the ionized PVD device is not restricted thereto. It is apparent that the ionized PVD device can be used for formation of a film which desires vertical growth, for example, formation of a wiring layer of a semiconductor device, formation of a buried plug of the contact hole and the like.

While the invention has been described in detail, the foregoing description is in all aspects illustrative and not restrictive. It is understood that numerous other modifications and variations can be devised without departing from the scope of the invention.

I claim:

1. An ionized PVD device comprising:
    a vacuum chamber having an almost S-shaped contour shape, both ends of which define first and second openings, wherein a semiconductor substrate is provided in a first opening side;
    a sputtering target provided in a second opening side;
    plasma producing means for setting said sputtering target and said vacuum chamber to negative and positive electrodes respectively and producing a plasma between said electrodes;
    bias voltage applying means for applying a bias voltage to said semiconductor substrate; and
    magnetic field forming means provided on an outside of said vacuum chamber so as to form an almost S-shaped magnetic field in said vacuum chamber along said almost S-shaped of said vacuum chamber,
    wherein said vacuum chamber has a set of bent portions which are bent in opposite directions to each other so that said first and second openings are not opposed to each other.

2. The ionized PVD device as defined in claim 1, wherein said magnetic field forming means comprises:
    a plurality of air-core coils; and
    a power supply for supplying a current to said air-core coils,
    said air-core coils being provided so as to surround at least said set of bent portions of said vacuum chamber.

3. The ionized PVD device as defined in claim 1, wherein said magnetic field forming means comprises:
    an integral air-core coil formed by winding a coil material around an external wall of said vacuum chamber along said shape of said vacuum chamber; and
    a power supply for supplying a current to said integral air-core coil.

4. The ionized PVD device as defined in claim 1, further comprising:
    a first removable cover capable of closing said first opening of said vacuum chamber;
    a second removable cover capable of closing said second opening of said vacuum chamber; and
    first and second electric insulators provided between said first and second removable covers and said vacuum chamber for electrically insulating said first and second removable covers from said vacuum chamber,
    wherein said semiconductor substrate is attached to said first removable cover, and
    said sputtering target is attached to said second removable cover.

5. The ionized PVD device as defined in claim 4, wherein said bias voltage applying means comprises:
    a high-frequency power supply having a first output terminal electrically connected to said first removable cover and a second output terminal connected to a ground potential; and
    a capacitive element provided between said first removable cover and said first output terminal of said high-frequency power supply for preventing a DC plasma induced current from flowing to a side of said semiconductor substrate facing said high-frequency power supply.

6. The ionized PVD device as defined in claim 1, further comprising neutral particle trapping means provided along an internal wall of said vacuum chamber for trapping neutral particles in said plasma,
    said neutral particle trapping means comprising:
    a plurality of metal rings, each metal ring having an opening having a predetermined size in a central portion; and
    a plurality of tubelike flexible plates for connecting said metal rings to form an array of said metal rings.

7. A method for manufacturing a semiconductor device, comprising the steps of:

preparing an ionized PVD device comprising a vacuum chamber having an almost S-shaped contour shape, both ends of which define first and second openings, wherein a semiconductor substrate is provided in a first opening side, a sputtering target provided in a second opening side, plasma producing means for setting said sputtering target and said vacuum chamber to negative and positive electrodes respectively and producing a plasma between said electrodes, bias voltage applying means for applying a bias voltage to said semiconductor substrate, and magnetic field forming means provided on an outside of said vacuum chamber so as to form an almost S-shaped magnetic field in said vacuum chamber along a shape of said vacuum chamber, wherein said vacuum chamber has a set of bent portions which are bent in opposite directions to each other so that said first and second openings are not opposed to each other;

exhausting air in said vacuum chamber to reduce a pressure of said vacuum chamber to a first pressure;

introducing at least one gas into said vacuum chamber to raise said pressure of said vacuum chamber to a second pressure;

applying a DC voltage across said sputtering target and said vacuum chamber as negative and positive electrodes respectively to produce a plasma of said at least one gas;

applying a bias voltage from said bias voltage applying means to said semiconductor substrate; and forming an almost S-shaped magnetic field in said vacuum chamber by said magnetic field forming means along said shape of said vacuum chamber, wherein a film including a material of said sputtering target as a principal material is formed on said semiconductor substrate.

8. The method for manufacturing a semiconductor device as defined in claim 7, wherein said semiconductor substrate has at least one contact hole formed perpendicularly to a major surface of said semiconductor substrate, and said film is formed on a bottom of said at least one contact hole and functions as a barrier layer metal.

9. The method for manufacturing a semiconductor device as defined in claim 8, wherein said at least one gas includes nitrogen gas or ammonia gas, and said film which functions as a barrier layer metal is formed of a nitride film including said material of said sputtering target as a principal material.

* * * * *